(12) United States Patent
Somma et al.

(10) Patent No.: US 11,842,948 B2
(45) Date of Patent: Dec. 12, 2023

(54) SMDS INTEGRATION ON QFN BY 3D STACKED SOLUTION

(71) Applicant: STMICROELECTRONICS S.R.L., Agrate Brianza (IT)

(72) Inventors: Cristina Somma, Cinisello Balsamo (IT); Fulvio Vittorio Fontana, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/244,378

(22) Filed: Apr. 29, 2021

(65) Prior Publication Data

US 2021/0249337 A1    Aug. 12, 2021

Related U.S. Application Data

(62) Division of application No. 16/782,797, filed on Feb. 5, 2020, now Pat. No. 11,004,775, which is a division of application No. 15/925,420, filed on Mar. 19, 2018, now Pat. No. 10,593,612.

(51) Int. Cl.
*H01L 23/495* (2006.01)

(52) U.S. Cl.
CPC .. *H01L 23/49503* (2013.01); *H01L 23/49517* (2013.01); *H01L 23/49575* (2013.01)

(58) Field of Classification Search
None
See application file for complete search history.

(56) References Cited

U.S. PATENT DOCUMENTS

| | | | |
|---|---|---|---|
| 7,023,085 B2 | 4/2006 | Pu | |
| 7,545,026 B2 | 6/2009 | Six | |
| 8,115,285 B2 | 2/2012 | Chen et al. | |
| 8,120,152 B2 | 2/2012 | Chang Chien et al. | |
| 8,445,999 B2 | 5/2013 | Cho | |
| 8,492,883 B2 | 7/2013 | Chien et al. | |
| 9,780,069 B2 | 10/2017 | Haga et al. | |
| 10,163,850 B2 | 12/2018 | Haga et al. | |
| 10,211,172 B2 | 2/2019 | Srivastava et al. | |

(Continued)

FOREIGN PATENT DOCUMENTS

| | | |
|---|---|---|
| CN | 101118895 A | 2/2008 |
| CN | 101587884 A | 11/2009 |

(Continued)

*Primary Examiner* — Telly D Green
(74) *Attorney, Agent, or Firm* — SEED IP LAW GROUP LLP

(57) ABSTRACT

One or more embodiments are directed to quad flat no-lead (QFN) semiconductor packages, devices, and methods in which one or more electrical components are positioned between a die pad of a QFN leadframe and a semiconductor die. In one embodiment, a device includes a die pad, a lead that is spaced apart from the die pad, and at least one electrical component that has a first contact on the die pad and a second contact on the lead. A semiconductor die is positioned on the at least one electrical component and is spaced apart from the die pad by the at least one electrical component. The device further includes at least one conductive wire, or wire bond, that electrically couples the at least one lead to the semiconductor die.

20 Claims, 9 Drawing Sheets

(56) References Cited

U.S. PATENT DOCUMENTS

| | | | |
|---|---|---|---|
| 2003/0011050 A1* | 1/2003 | Bissey | H01L 24/49 |
| | | | 257/E23.057 |
| 2005/0230842 A1 | 10/2005 | Swanson et al. | |
| 2006/0081967 A1 | 4/2006 | Ha et al. | |
| 2007/0215996 A1 | 9/2007 | Otremba | |
| 2009/0230523 A1 | 9/2009 | Chien et al. | |
| 2009/0230524 A1 | 9/2009 | Chien et al. | |
| 2009/0230525 A1 | 9/2009 | Chang Chien et al. | |
| 2009/0230526 A1 | 9/2009 | Chen et al. | |
| 2009/0267220 A1 | 10/2009 | Kuhlman et al. | |
| 2011/0278709 A1* | 11/2011 | Lu | H01L 23/58 |
| | | | 257/676 |
| 2015/0200181 A1 | 7/2015 | Haga et al. | |
| 2015/0262944 A1 | 9/2015 | Srivastava et al. | |
| 2017/0133302 A1 | 5/2017 | Truhitte et al. | |
| 2017/0194233 A1* | 7/2017 | Castro | H01L 23/49575 |
| 2018/0005981 A1 | 1/2018 | Haga et al. | |

FOREIGN PATENT DOCUMENTS

| | | |
|---|---|---|
| CN | 101663749 A | 3/2010 |
| CN | 102420217 A | 4/2012 |
| CN | 107799511 A | 3/2018 |
| JP | 2004047811 A | 2/2004 |

\* cited by examiner

SMDS INTEGRATION ON QFN BY 3D STACKED SOLUTION

BACKGROUND

Technical Field

Embodiments of the present disclosure are generally directed to semiconductor packages and methods in which one or more electrical components are positioned on a QFN leadframe and positioned between a semiconductor die and the leadframe.

Description of the Related Art

Semiconductor packages, such as system in package (SiP) devices come in m any forms, including ball grid array (BGA) packages, land grid array (LGA) packages, and quad flat no-lead ("QFN") packages.

QFN packages are common in the packaging space because of their small size and excellent performance for many applications. These packages include leadframes having a back surface of a die pad exposed on a back of the package. Leads are also exposed on the back of the package and are spaced apart from and surrounding the die pad. Within the package, the leadframes support a die in a central position and often include wire bonds from the die to the leads. A molding compound or sealant is formed over the die, the wires, and the leadframe to complete the package.

Conventional QFN packages are generally limited in terms of available space, which limits the number of components that can be integrated in such packages. Moreover, the lead pitch of standard QFN leadframes typically doesn't match with the dimensions of surface mounted devices (SMDs), which limits or prohibits mounting of such SMDs on a QFN leadframe. Instead, in order to integrate SMDs in a QFN package, the size of the package in conventional designs is typically increased.

BRIEF SUMMARY

In various embodiments, the present disclosure provides quad flat no-lead (QFN) semiconductor packages, devices, and methods in which one or more electrical components are positioned between a die pad of a QFN leadframe and a semiconductor die.

In one embodiment, the present disclosure provides a device that includes a die pad, a lead that is spaced apart from the die pad, and at least one electrical component that has a first contact on the die pad and a second contact on the lead. A semiconductor die is positioned on the at least one electrical component and is spaced apart from the die pad by the at least one electrical component. The device further includes at least one conductive wire, or wire bond, that electrically couples the at least one lead to the semiconductor die.

In another embodiment, the present disclosure provides a method that includes: electrically and mechanically coupling first terminals of a plurality of electrical components to respective leads of a quad flat no-lead (QFN) leadframe; electrically and mechanically coupling second terminals of the plurality of electrical components to a die pad of the QFN leadframe; attaching a semiconductor die to the plurality of electrical components, the semiconductor die being spaced apart from the die pad by the plurality of electrical components, the semiconductor die having an active surface facing away from the die pad; and forming wire bonds between the active surface of the semiconductor die and the leads of the QFN leadframe.

In yet another embodiment, the present disclosure provides a method that includes: electrically and mechanically coupling first terminals of a plurality of electrical components to respective raised leads of a QFN multi-row (QFN-mr) leadframe; electrically and mechanically coupling second terminals of the plurality of electrical components to a raised die pad of the QFN-mr leadframe; attaching a semiconductor die to the plurality of electrical components, the semiconductor die being spaced apart from the die pad by the plurality of electrical components, the semiconductor die having an active surface facing away from the die pad; forming wire bonds between the active surface of the semiconductor die and the raised leads of the QFN-mr leadframe; and separating the raised leads from the raised die pad by removing portions of the QFN-mr leadframe between the raised leads and the raised die pad.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with leadframes and chip packaging have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in the specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

The present disclosure is directed to integrating components in a QFN package without increasing a surface area or footprint of the QFN leadframe. More particularly, the present disclosure provides various systems and methods in which one or more electronic components are provided on the leadframe and a semiconductor die is stacked on the one or more electronic components.

Figure 1A:
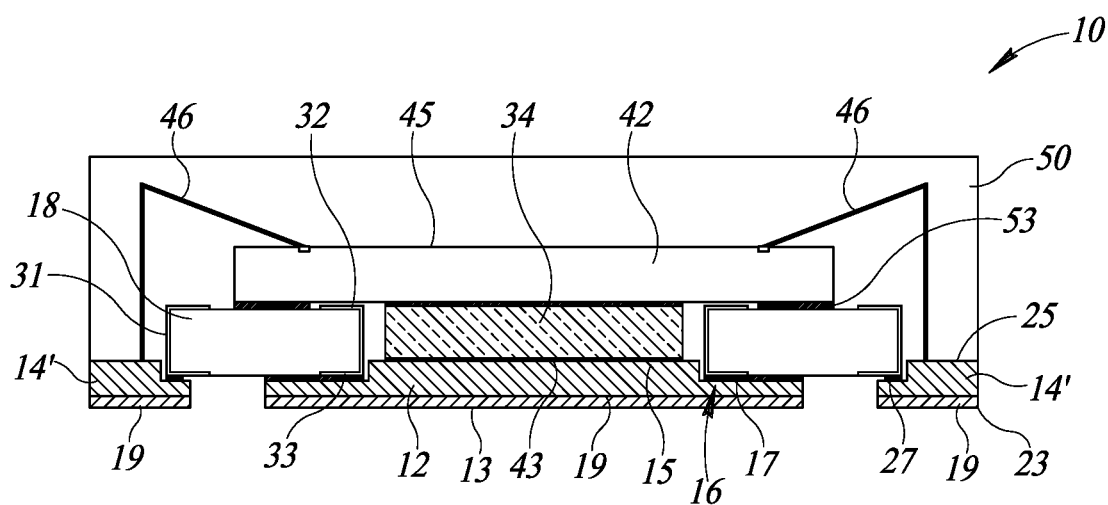
FIG. 1A is a cross-sectional view of a QFN semiconductor package, in accordance with one or more embodiments of the present disclosure.
Figure 1B:
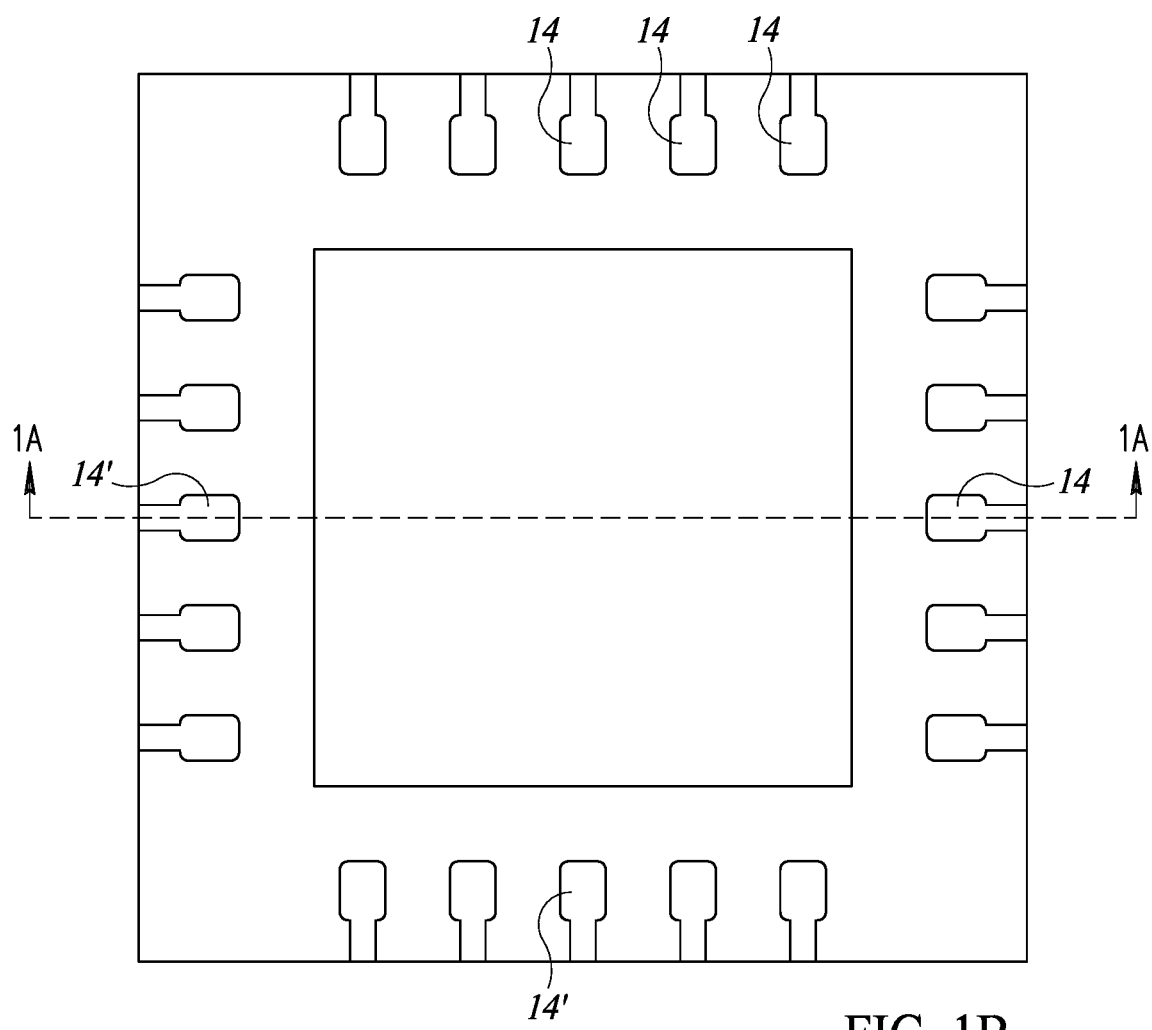
FIG. 1B is a bottom view of the QFN semiconductor package shown in FIG. 1, in accordance with one or more embodiment.

FIG. 1A is a cross-sectional view illustrating a QFN package 10 in accordance with one or more embodiments of the present disclosure. FIG. 1B is a bottom view of the package 10. The package 10 includes a die pad 12 and a plurality of leads 14 that are spaced apart from the die pad 12 in a lateral direction (e.g., in the horizontal direction as shown in FIG. 1A). The die pad 12 and the leads 14 may be provided on a pre-formed QFN leadframe, which may be made of any conductive material, such as copper or a copper alloy.

The plurality of leads 14 includes one or more recessed leads 14', each of which includes a recessed portion. The cross-sectional view of FIG. 1A illustrates two recessed leads 14', each of which is spaced apart from the die pad 12. The die pad 12 has corresponding recesses that are aligned with the recesses in the recessed leads 14', as will be discussed in further detail below.

The die pad 12 has a lower surface 13 and an upper surface 15. One or more recesses 16 are formed near the periphery of the die pad 12. For example, as shown in the cross-sectional view of FIG. 1A, two recesses 16 may be formed on opposite sides of the die pad 12. It should be readily appreciated that one or more additional recesses 16 may be formed in the die pad 12 at positions that are spaced apart from one or more corresponding recessed leads 14'. The recesses 16 extend through the upper surface 13 of the die pad 12 and form a recessed surface 17 that is between the upper surface 13 and the lower surface 15 of the die pad.

One or more of the plurality of leads 14 are recessed leads 14', each of which has a lower surface 23, an upper surface 25, and a recessed surface 27 that is between the lower surface 23 and the upper surface 25. The lower surface 23 of the recessed leads 14' may be substantially coplanar with the lower surface 13 of the die pad 12. Similarly, the upper surface 25 of the recessed leads 14' may be substantially coplanar with the upper surface 15 of the die pad 12, and the recessed surface 27 of the recessed leads 14' may be substantially coplanar with the recessed surface 17 of the die pad 12.

Although not shown in the cross-sectional view of FIG. 1A, some of the plurality of leads 14 may not include the recessed portions. The non-recessed leads instead have an upper surface that may be substantially coplanar with the upper surface 15 of the die pad 12, and a lower surface that may be substantially coplanar with the lower surface 13 of the die pad 12.

The lower surfaces 23 of leads 14 and the lower surface 13 of the die pad 12 may include a plated conductive layer 19. The plated conductive layer 19 may be any layer or layers including one or more conductive materials. For instance, the plated conductive layer 19 may include one or more metal materials, such as Ni/Pd/Ag, Ni/Pd/Au—Ag alloy, or Ni/Pd/Au/Ag. The plated conductive layer 19 may be made from materials that prevent the QFN leadframe from oxidizing.

The lower surfaces 23 of the leads 14 may be referred to as lands of the package 10 and are configured to electrically couple the package 10 to another device or board, such as a printed circuit board (PCB).

As shown in FIG. 1B, the package 10 includes five leads 14 positioned along each of four sides near the periphery of the package 10, and the leads 14 are spaced apart from the die pad 12 laterally. One of the five leads 14 positioned along each side of the package 10 is a recessed lead 14', while the remaining four leads of each side are non-recessed leads. It is to be appreciated, however, that any total number of leads (including any combination of recessed and non-recessed leads) may be located on any number of sides of the die pad 12.

The recesses 16 in the die pad 12 are aligned with corresponding recessed leads 14', as shown in FIG. 1A. More particularly, each of the recessed surfaces 17 of the die pad 12 is aligned in a lateral direction with a corresponding recessed surface 27 of a respective recessed lead 14'. The recessed surfaces 17 of the die pad 12 may be substantially coplanar with the recessed surfaces 27 of the recessed leads 14.

The package 10 further includes one or more electrical components 18, which may be any surface mount device (SMD) that can be mounted on a surface (e.g., of the die pad 12 and the recessed lead 14') using surface mount technology (SMT). In one or more embodiments, the electrical components 18 may be passive components, such as resistors, capacitors, and inductors. In some embodiments, the electrical components 18 may be active components, including semiconductor components such as diodes, transistors, and even integrated circuits. As shown in FIG. 1A, the electrical components 18 may be two-terminal components; however, it should be readily appreciated that embodiments provided herein are not limited thereto.

Each of the electrical components 18 includes at least a first terminal 31 and a second terminal 32. The first terminal 31 is positioned on the recessed surface 27 of one of the recessed leads 14', and the second terminal 32 is positioned on the corresponding recessed surface 17 of the die pad 12. The first terminal 31 may be electrically and mechanically coupled to the recessed surface 27 of the recessed lead 14' by a conductive adhesive, such as conductive glue 33. Similarly, the second terminal 32 may be electrically and mechanically coupled to the recessed surface 17 of the die pad 12 by a conductive adhesive, such as conductive glue 33. The recesses in the recessed leads 14' and in the die pad 12 reduce the overall height of the package 10 when the electrical components 18 are stacked on the die pad 12 and recessed leads 14'.

In one or more embodiments, a die support 34 is secured to the upper surface 15 of the die pad 12 by an adhesive material 43, such as glue or any other suitable adhesive. In some embodiments, the adhesive material 43 may be the same material as the conductive glue 33, which may be electrically conductive and/or thermally conductive. The die support 34 may be formed of any electrically and/or thermally conductive material, and in one or more embodiments, the die support 34 is a copper stud. The die support 34 may provide an electrical and/or thermal conduction path to the lower surface 13 of the die pad 12. Accordingly, the die support 34 may facilitate dissipation of heat generated from a semiconductor die 42.

The semiconductor die 42 may be any semiconductor die including one or more electrical components, such as integrated circuits. The semiconductor die 42 is made from a semiconductor material, such as silicon, and includes an active surface 45 in which integrated circuits are formed. The integrated circuits may be analog or digital circuits implemented as active devices, passive devices, conductive layers, and dielectric layers formed within the semiconductor die 42 and electrically interconnected according to the electrical design and function of the semiconductor die.

The semiconductor die 42 is secured to the die support 34 and/or to upper surfaces of the electrical components 18 by an adhesive material 53. The adhesive material may be any material suitable to secure the semiconductor die 42 to the die support 34, such as glue, paste, tape, and the like. The adhesive material 53 may be the same material as the adhesive material 43 and/or the conductive glue 33. In one or more embodiments, the adhesive material may be a die attach film suitable to attach the semiconductor die 42 to the die support 34.

In some embodiments, the semiconductor die 42 is supported by the die support 34 and is spaced apart from the electrical components 18. In such embodiments, the semiconductor die 42 extends at least partially over the electrical components 18 and provides an overhang region in which the electrical components 18 are positioned.

In some embodiments, the semiconductor die 42 is supported by both the die support 34 and the electrical components 18. In such embodiments, upper surfaces of the die support 34 and the electrical components 18 may be substantially co-planar, which provides a relatively uniform and flat surface for attaching the semiconductor die 42.

In some embodiments, the die support 34 may be omitted, in which case, the semiconductor die 42 is attached to and supported by the electrical components 18 that are positioned at least partially between the semiconductor die 42 and the die pad 12.

The semiconductor die 42 is secured to the die support 34 and/or the electrical components 18 with the active surface 45 of the semiconductor die facing away from the upper surface 15 of the die pad 12, as shown in FIG. 1A.

Conductive wires 46 electrically couple the semiconductor die 42 to the leads 14, including the recessed leads 14'. For example, the conductive wires 46 may electrically couple respective bond pads on the active surface 45 of the semiconductor die 42 to respective leads 14 and/or recessed leads 14'.

Encapsulation material 50 is formed over the semiconductor die 42, and covers the semiconductor die 42 and the conductive wires 46. The encapsulation material 50 is also located between the leads 14, 14' and the die pad 12 and forms a part of the bottom surface of the package 10 along with the lower surface 13 of the die pad 12 and the bottom surfaces of the leads 14 and recessed leads 14'. The encapsulation material 50 may substantially fill any spaces or gaps between the various components in the package 10. The encapsulation material 50 is an electrically insulating material that protects the electrical components 18, semiconductor die 42, conductive wires 46, and any other electrical components or wiring from damage, such as corrosion, physical damage, moisture damage, or other causes of damage to electrical devices and materials. In one or more embodiments, the encapsulation material 50 is a molding compound, which may include, for example, a polymer resin.

The exposed bottom surfaces of the leads 14 and recessed leads 14', as well as the exposed bottom surface of the die pad 12, facilitate electrical and/or mechanical coupling of the package 10 to external circuitry, such as to an external printed circuit board.

FIGS. 2A-2F are perspective views showing various stages of a method of manufacturing semiconductor packages, such as the QFN package 10 of FIG. 1, in accordance with one or more embodiments.

Figure 2A:
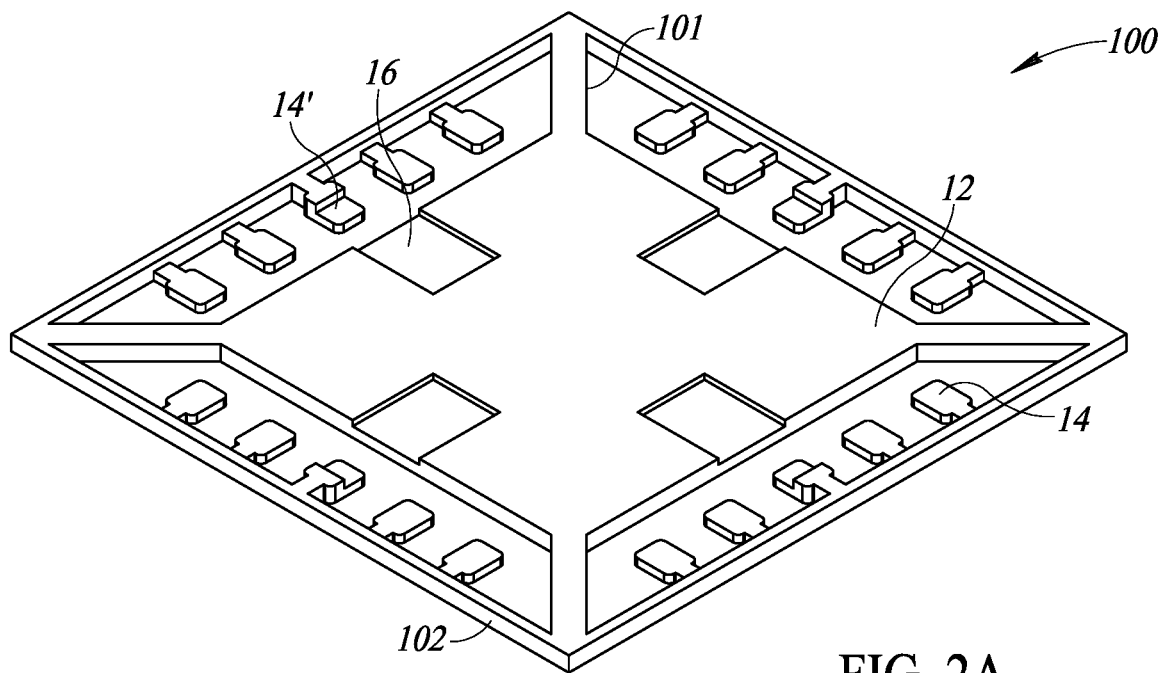
FIGS. 2A-2F are perspective views illustrating a method of manufacturing semiconductor packages, such as the QFN package shown in FIG. 1, in accordance with one or more embodiments.

As shown in FIG. 2A, a QFN leadframe 100 is provided. The QFN leadframe 100 can be formed by any suitable techniques, including by one or more of stamping, etching, laser processing or the like. The leadframe 30 can be manufactured from copper, aluminum, gold, or any other conductive material.

The leadframe 100 includes a plurality of leads 14, 14' that are spaced apart from the die pad 12. The leadframe 100 includes tie bars 101 that connect the die pad 12 to edges 102 that form a periphery of the leadframe 100. The plurality of leads 14, which includes one or more recessed leads 14', are connected along inner surfaces of the edges 102 of the leadframe 100, such that the leads 14, 14' are positioned between the edges 102 and the die pad 12.

The leadframe 100 includes the recessed leads 14', each of which include an upper surface 25, a lower surface 23, and a recessed surface 27 as shown in FIG. 1. Similarly, the leadframe 100 includes recesses 16 formed in the die pad 12, and the recesses 16 include a recessed surface 17 that is between the upper surface 13 and the lower surface 15 of the die pad 12, as shown in FIG. 1. The recesses 16 in the die pad 12 are aligned with corresponding recessed leads 14'.

Figure 2B:
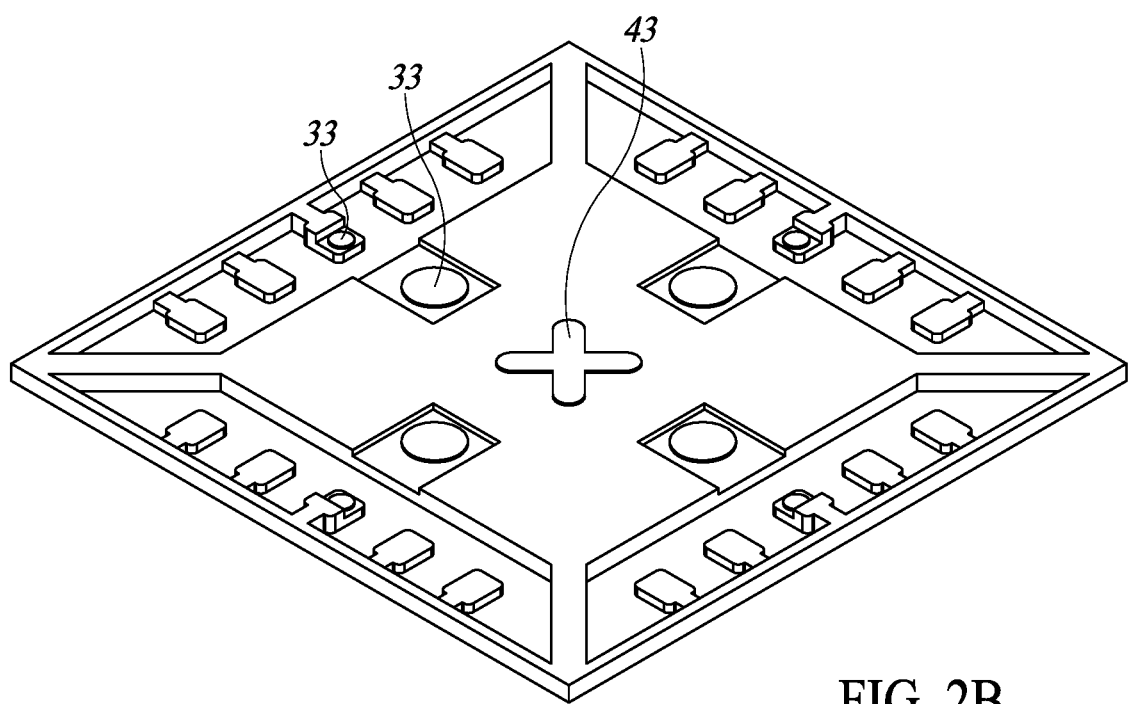

As shown in FIG. 2B, a conductive adhesive, such as conductive glue 33, is dispensed on the recessed surfaces 27 of the recessed leads 14' and in the recesses 16 of the die pad 12.

Further, adhesive material 43 is dispensed on the upper surface 15 of the die pad 12. As shown in FIG. 2B, the adhesive material 43 may be applied in a central region of the die pad 12, e.g., in a region that is between the recesses 16. However, in other embodiments, the adhesive material 43 may be applied in other regions of the die pad 12, which may depend on a number and positioning of the recesses 16, which may vary depending upon a desired design.

The adhesive material 43 may be glue or any other suitable adhesive. In some embodiments, the adhesive material 43 is the same material as conductive glue 33.

Figure 2C:
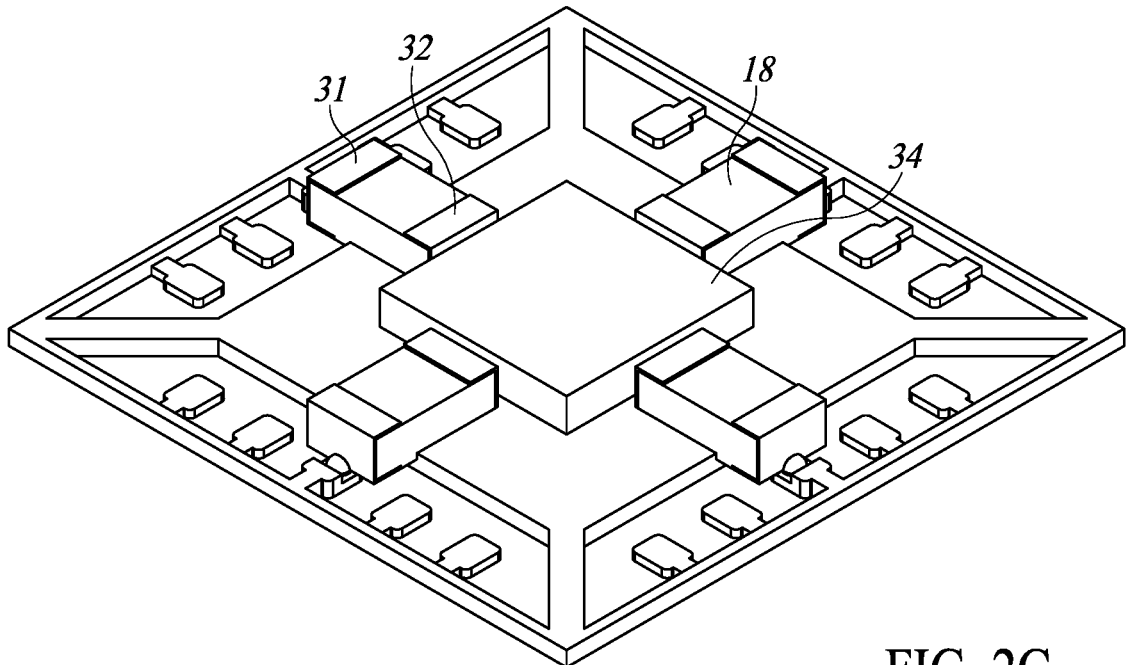

As shown in FIG. 2C, the die support 34 and electrical components 18 are attached to the leadframe 100. Each of the electrical components 18 includes a first terminal 31 that is electrically and mechanically coupled to a recessed surface of a respective recessed lead 14' by the conductive glue 33. Further, each of the electrical components 18 has a second terminal 32 that is electrically and mechanically coupled to a corresponding recessed surface 17 of the die pad 12 by the conductive glue 33.

The die support 34 is positioned between the electrical components 18, e.g., in a central region of the die pad 12, and is attached to the die pad 12 by the adhesive material 43.

Figure 2D:
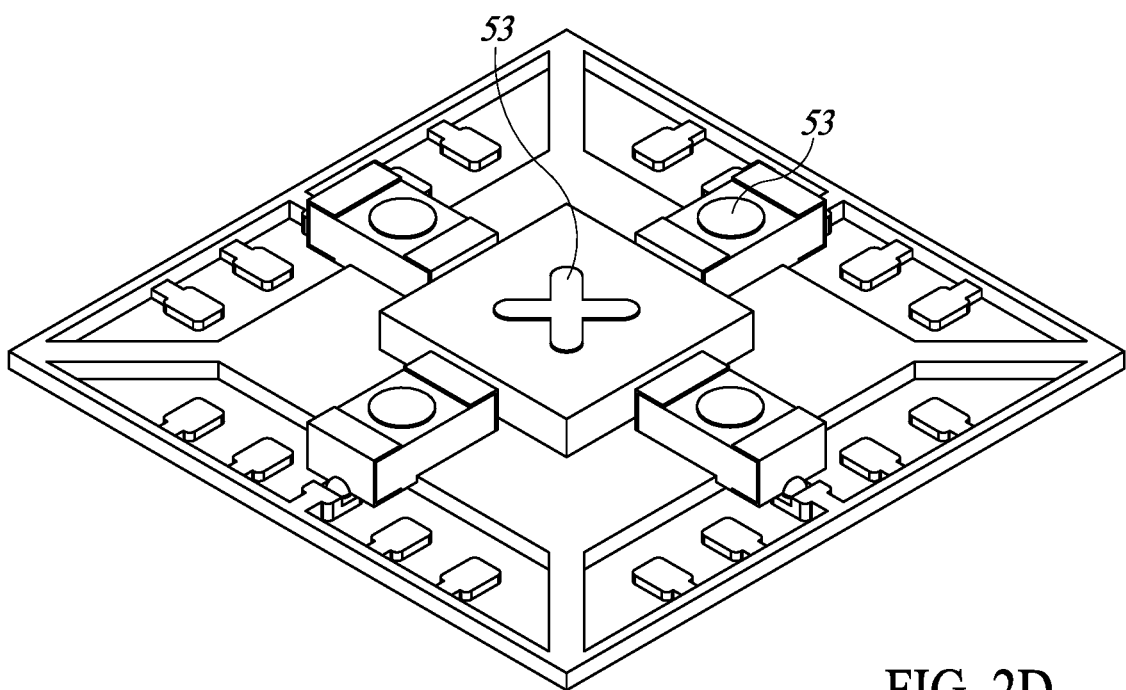

As shown in FIG. 2D, adhesive material 53 is applied to upper surfaces of the electrical components 18 and the die support 34. The adhesive material 53 may be the same material as the adhesive material 43 and/or the conductive glue 33. The adhesive material 53 may be any adhesive material suitable to secure the semiconductor die 42 to the die support 34 and/or to upper surfaces of the electrical components 18, such as glue, paste, tape, die attach film, and the like.

Figure 2E:
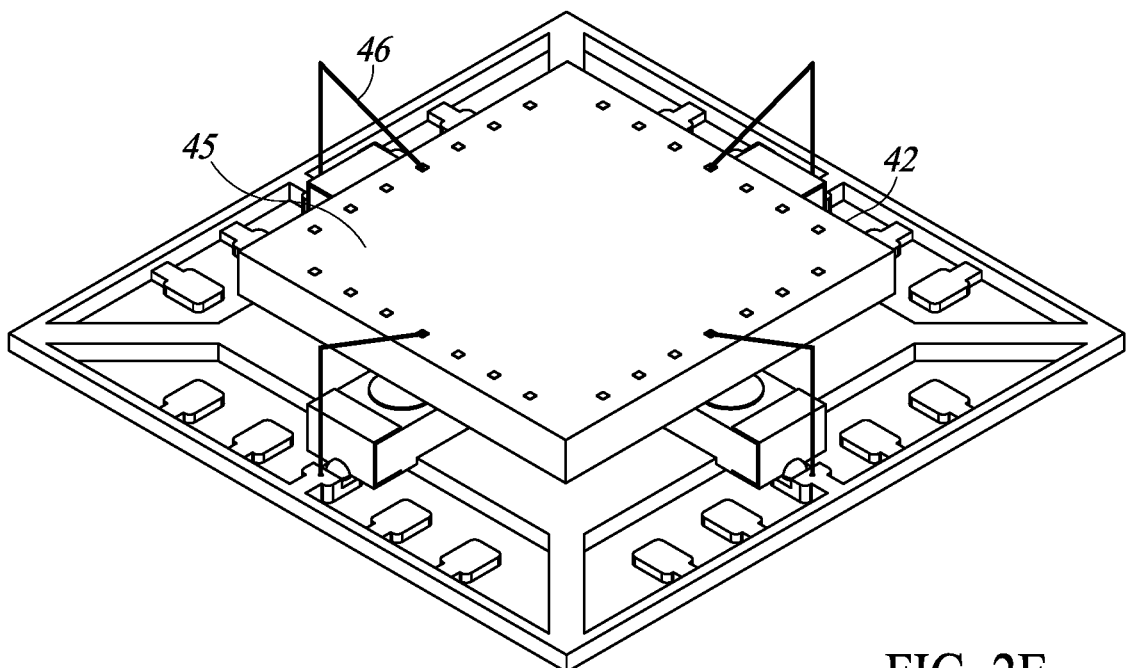

As shown in FIG. 2E, the semiconductor die 42 is attached to the electrical components 18 and/or the die support 34 by the adhesive material 53. The semiconductor die 42 covers the die support 34 and may further cover at least part of each of the electrical components 18. The semiconductor die 42 is positioned so that the active surface 45 of the semiconductor die 42 is facing away from the upper surface of the die pad 12, as shown.

Conductive wires 46 are formed, for example by wire bonding, and couple bond pads on the active surface 45 of the semiconductor die 42 to the leads 14 and/or the recessed leads 14'. For example, as shown in FIG. 2E, conductive wires 46 may be formed between respective bonds on the active surface 45 and the recessed leads 14', which electrically couple the semiconductor die 42 to each of the electrical components 18. While FIG. 2E shows conductive wires 46 formed only between the semiconductor die 42 and the recessed leads 14', it should be readily appreciated that additional conductive wires 46 may be formed between the bond pads on the semiconductor die 42 and any or all of the leads 14 and recessed leads 14' on the leadframe 100.

Figure 2F:
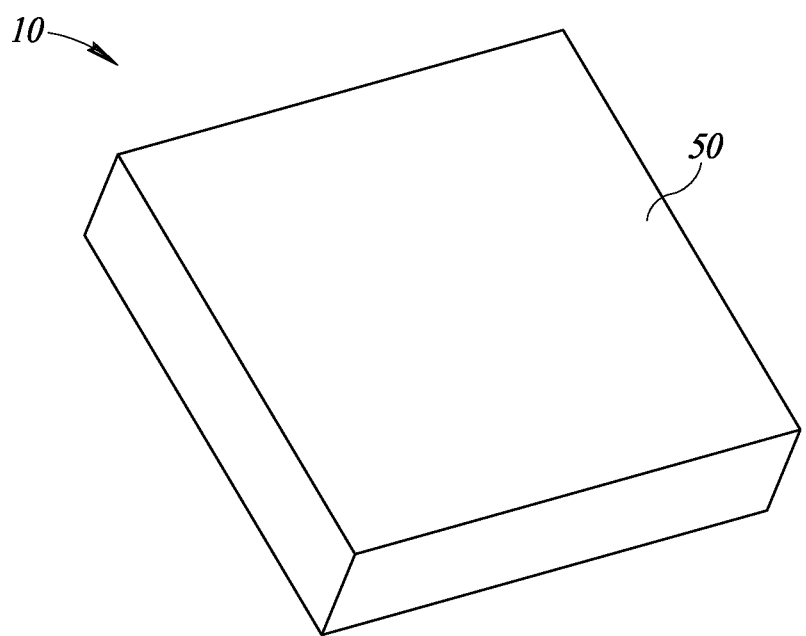

As shown in FIG. 2F, encapsulation material 50 is formed over the semiconductor die 42, and covers the semiconductor die 42 and the conductive wires 46. The encapsulation material 50 is also formed between the leads 14, 14' and the die pad 12 and may substantially fill any spaces or gaps between the various components in the package 10. The encapsulation material 50 may also form a part of the bottom surface of the package 10.

The encapsulation material 50 may be formed by any conventional techniques, such as by an underfill molding process. For example, the underfill molding process may include injecting a molding material, such as a resin molding compound, into a mold. The molding material is then hardened, which may involve a curing step. Upon hardening the encapsulation material 50 forms one or more outer surfaces of the package 10.

Further, portions of the leadframe 100 may be removed before or after forming the encapsulation material 50. For example, the edges 102 along the periphery of the leadframe 100 may be removed by any suitable technique, including by mechanical cutting, etching, or the like. This may performed after the encapsulation material 50 is formed, in which case, the encapsulation material 50 may be formed to extend only to outer edges of the leads 14, 14', such that only the edges 102 of the leadframe 100 are exposed after the encapsulation material 50 is formed. The edges 102 may then be cut to form the completed package 10. Similarly, the tie bars 101 may be removed by cutting, etching or the like. Additionally or alternatively, the ties bars 101 may be partially or fully encapsulated by the encapsulation material 50.

FIGS. 3A-3G are various perspective and cross-sectional views showing various stages of a method of manufacturing semiconductor packages on a QFN multi-row (QFN-mr) leadframe, in accordance with one or more embodiments.

Figure 3A:
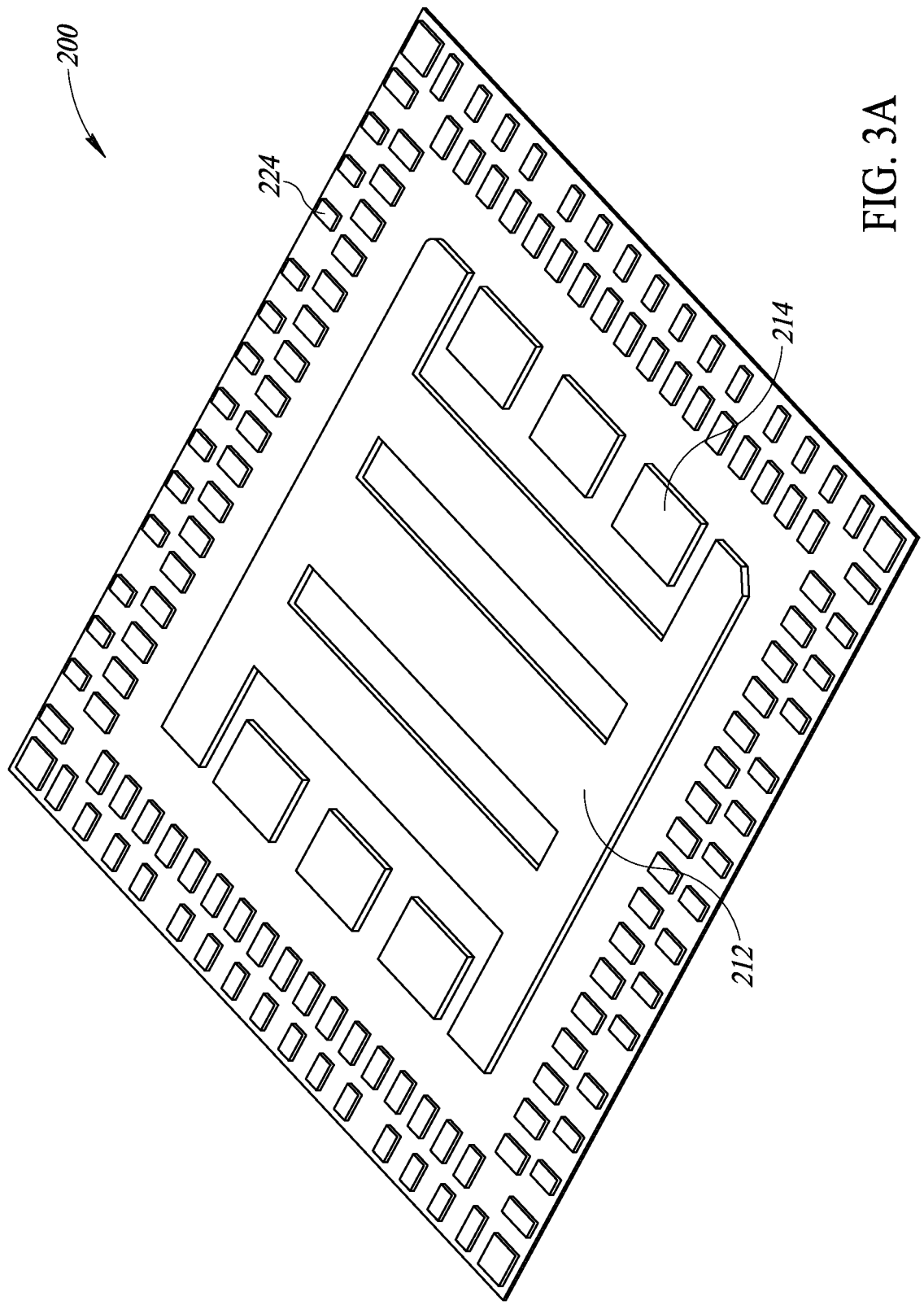
FIGS. 3A-3G are perspective and cross-sectional views illustrating a method of manufacturing a semiconductor package on a QFN multi-row leadframe, in accordance with one or more embodiments.

As shown in FIG. 3A, a QFN-mr leadframe 200 is provided. The QFN-mr leadframe 200 may be a "half cut" leadframe, with a plurality of raised portions that have a thickness that is greater than the thickness of the remaining portions of the leadframe 200. More particularly, the leadframe 200 includes a raised die pad 212, raised inner leads 214, and a plurality of raised outer leads 224 that may be arranged in one or more rows near the periphery of the leadframe 200. Although not shown in FIG. 3A, a back surface of the leadframe 200 may include a plated conductive layer underlying the plurality of raised portions.

Figure 3B:
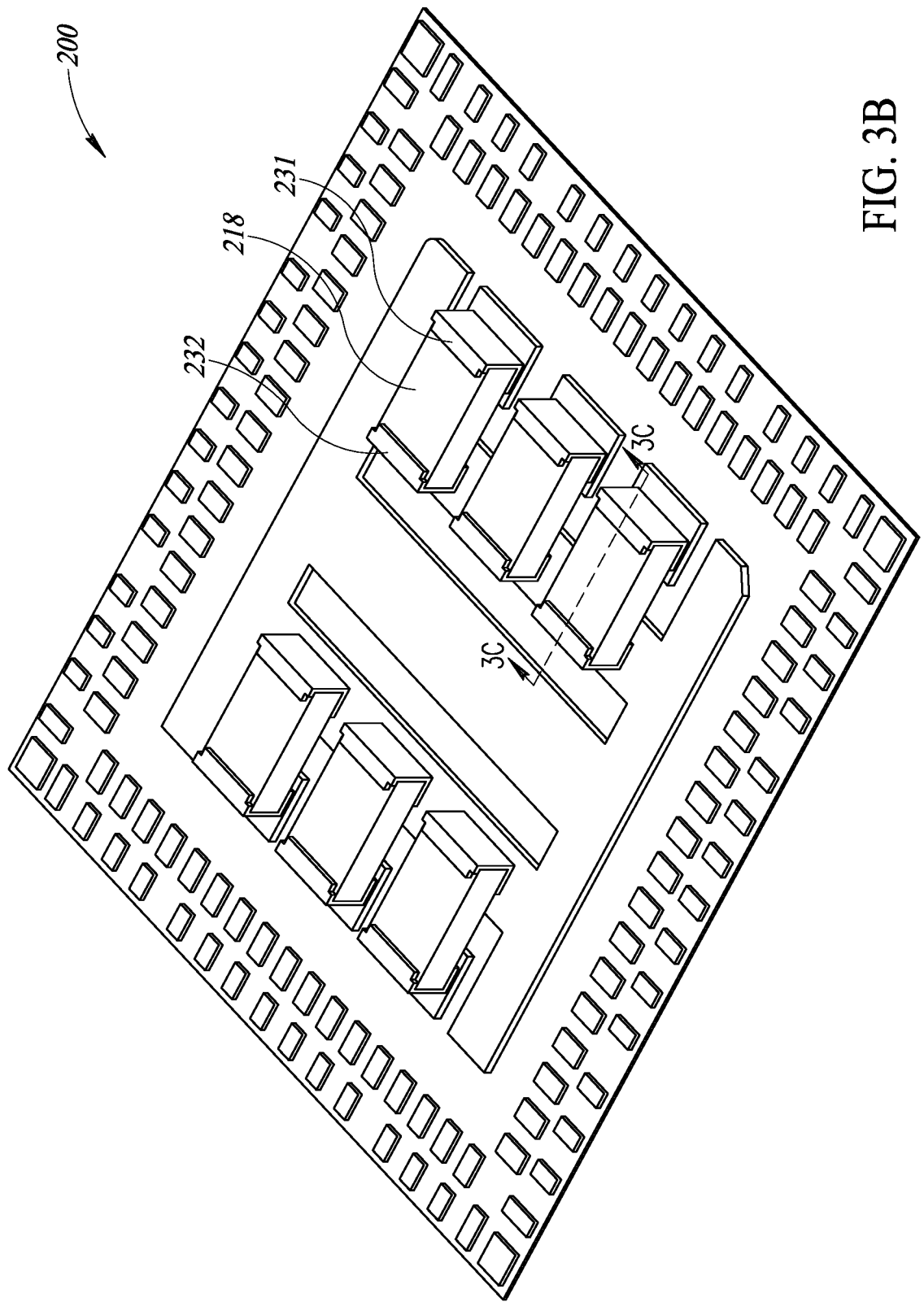

As shown in FIG. 3B, one or more electrical components 218 are attached to the leadframe 200. Each of the electrical components 218 includes at least a first terminal 231 and a second terminal 232. The first terminal 231 is positioned on a raised inner lead 214, and the second terminal 232 is positioned on the raised die pad 212.

Figure 3C:
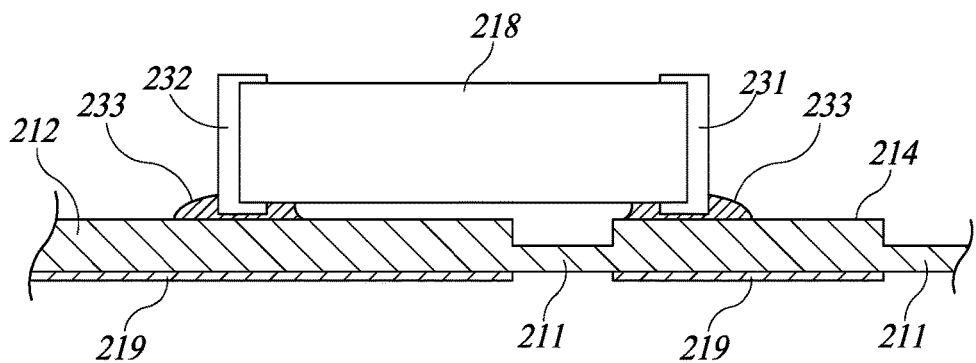

As can be seen in the cross-sectional view of FIG. 3C, which is taken along the line 3C-3C of FIG. 3B, half-cut portions 211 of the leadframe 200 are thinner than the raised die pad 212 and the raised inner leads 214. As shown, half-cut portions 211 may be positioned between the die pad 212 and inner leads 214, and further may be positioned between the inner leads 214 and the outer leads 224. Also as shown in FIG. 3C, a plated conductive layer 219 may be provided on a back surface of the leadframe 200, and positioned under the raised portions, i.e., under the raised die pad 212, the raised inner leads 214 and/or the raised outer leads 224. The plated conductive layer 219 may be any layer or layers including one or more conductive materials. For example, the plated conductive layer 219 may include one or more metal materials, such as Ni/Pd/Ag, Ni/Pd/Au—Ag alloy, or Ni/Pd/Au/Ag. The plated conductive layer 219 may be made from materials that prevent the leadframe 200 from oxidizing, and further may be made from materials that prevent or inhibit etching by an etchant that is later used to etch the half-cut portions 211.

The first terminal 231 of each of the electrical components 218 is electrically and mechanically coupled to a respective raised inner lead 214 by a conductive adhesive, such as conductive glue 233. Similarly, the second terminal 232 is electrically and mechanically coupled to the raised die pad 212 by a conductive adhesive, such as conductive glue 233. For example, conductive glue 233 may be applied on upper surfaces of the inner leads 214 and on an upper surface of the die pad 212 at positions aligned with corresponding ones of the inner leads 214. The electrical components 18 may be then be brought into contact with the conductive glue, with the first terminal 231 being in contact with the conductive glue 233 on the inner lead 214, and the second terminal 232 being in contact with the conductive glue 233 on the die pad 212.

In one or more embodiments, the electrical components 218 may be passive components, such as resistors, capacitors, and inductors. In some embodiments, the electrical components 218 may be active components, including semiconductor components such as diodes, transistors, and even integrated circuits.

Figure 3D:
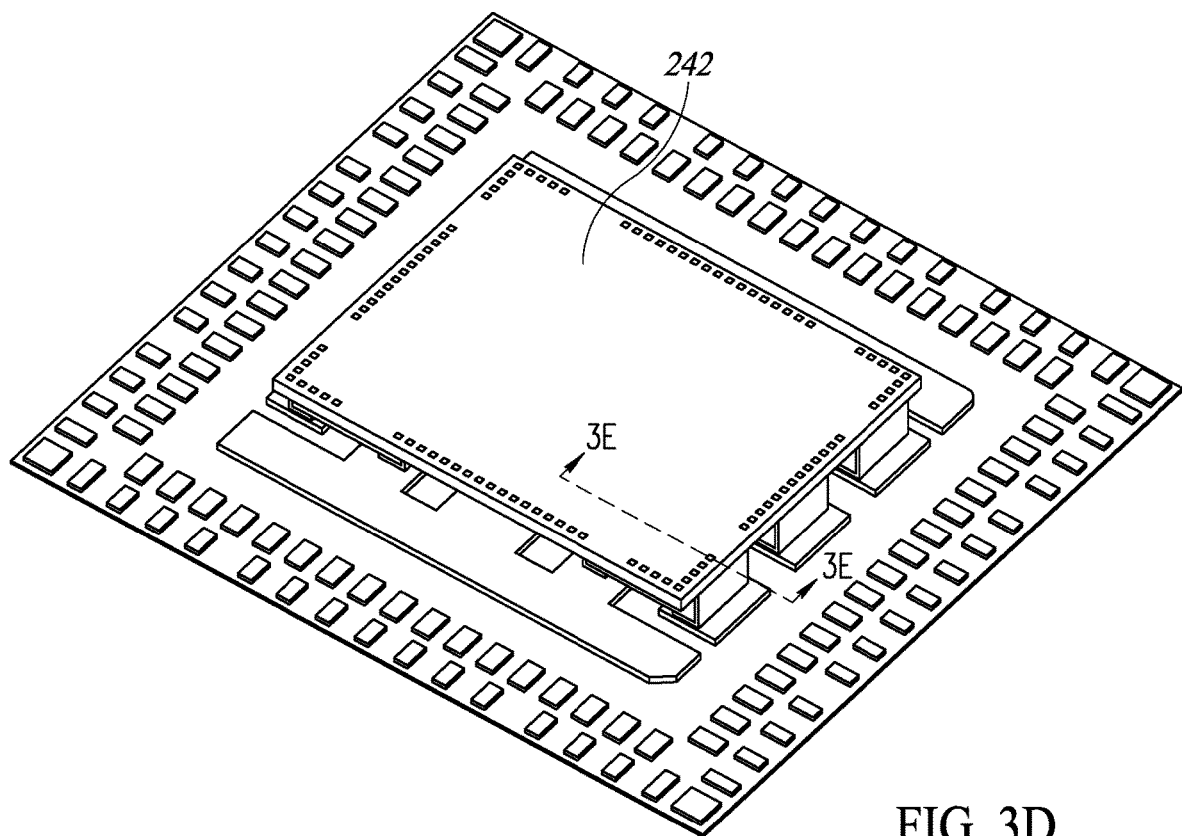
Figure 3E:
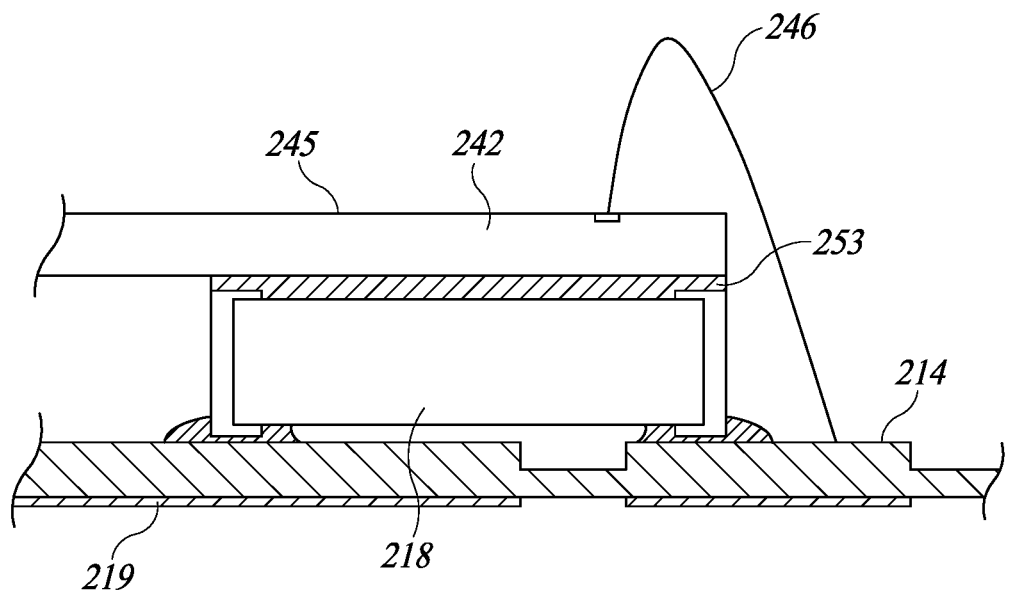

As shown in FIGS. 3D and 3E, a semiconductor die 242 is positioned over and attached to the electrical components 218. FIG. 3E is a cross-sectional view taken along the line 3E-3E of FIG. 3D. As shown in FIG. 3E, the semiconductor die 242 may be attached to the electrical components 218 by an adhesive 253. The adhesive 253 may be any adhesive material suitable to secure the semiconductor die 242 to the upper surfaces of the electrical components 18, such as glue, paste, tape, die attach film, and the like.

Conductive wires 246 are formed, for example by wire bonding, and electrically couple bond pads on the active surface 245 of the semiconductor die 242 to the raised inner leads 214, as shown in FIG. 3E. Moreover, conductive wires 246 may be formed between bond pads on the active surface 245 of the semiconductor die 242 and one or more of the raised outer leads 224.

Figure 3F:
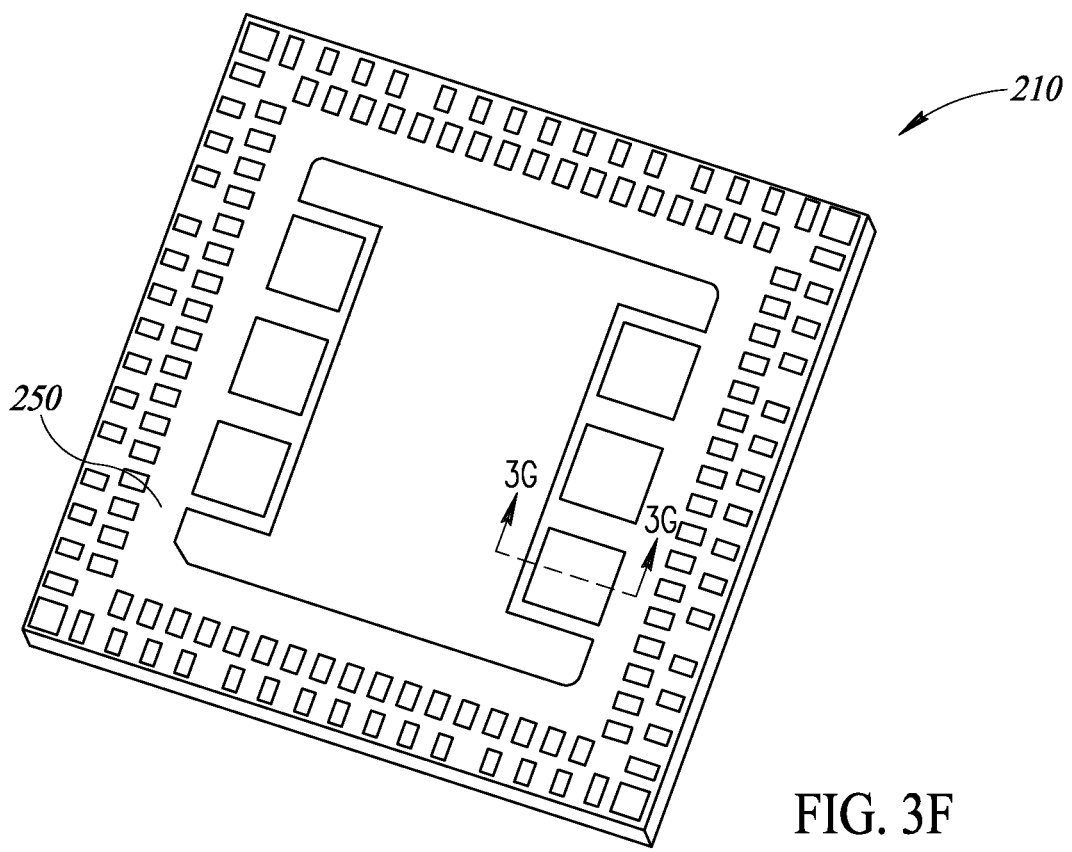
Figure 3G:
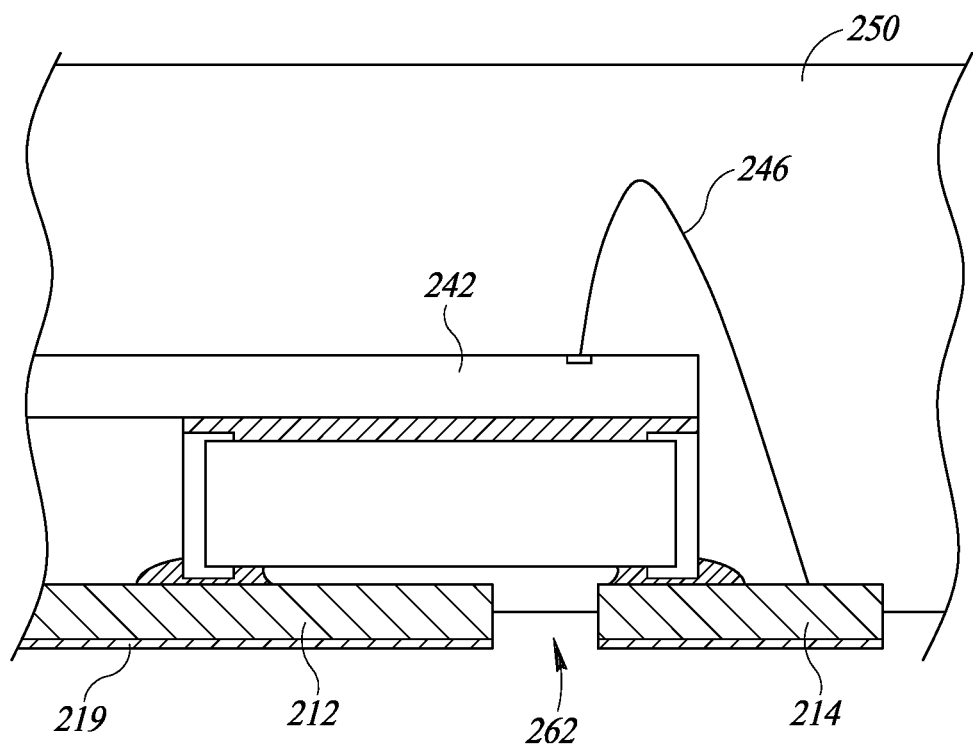

As shown in FIGS. 3F and 3G, an encapsulation material 250 is formed and the leadframe 200 is back-etched to form a completed semiconductor package 210. FIG. 3F is a perspective view showing a back surface of the semiconductor package 210, and FIG. 3G is a cross-sectional view taken along the line 3G-3G of FIG. 3F.

As can be seen in FIGS. 3F and 3G, the encapsulation material 250 is formed over the semiconductor die 242, and covers the semiconductor die 242 and the conductive wires 246. The encapsulation material 250 is also formed in the recesses 262 that are formed by etching through the half-cut portions 211, i.e., between the die pad 212 and the inner leads 214 and between the inner leads 214 and the outer leads 224. The encapsulation material 250 may substantially fill any spaces or gaps between the various components in the semiconductor package 210, including any spaces between the electrical components 218 and/or the semiconductor die 242 and the leadframe 200. The encapsulation material 250 may also form a part of the back of the semiconductor package 210, as shown in FIG. 3F.

The half-cut portions 211 of the leadframe 200 are removed, for example, by back etching. That is, the back surface of the leadframe 200 may be etched using any suitable etchant to remove the half-cut portions 211. During back etching, the etchant removes only half-cut portions 211, while the portions of the back surface of the leadframe 200 corresponding with the raised portions, i.e., the portions covered by the plated conductive layer 219, remain after the etching. By removing the half-cut portions 211, the back etching electrically isolates the die pad 212, the raised inner leads 214, and the raised outer leads 224 from one another.

The exposed portions of the leadframe 200 on the back surface of the completed QFN package 210 may be electrically and/or mechanically coupled to external circuitry, such as a printed circuit board.

In some embodiments, more than one semiconductor die may be included in a QFN package. For example, a plurality of semiconductor dice may be positioned side-by-side, with each of the semiconductor dice being spaced apart from the leadframe (e.g., a standard QFN leadframe, or a QFN-mr leadframe) by a plurality of electrical components. In some embodiments, two or more semiconductor dice may be stacked on each another, with one or more electrical components positioned between a first one of the semiconductor dice and the QFN leadframe. In still further embodiments, one or more spacers, such as a copper stud, may be provided between the electrical components and the semiconductor die.

As has been described with respect to various embodiments of QFN leadframe packages provided herein, a semiconductor die is stacked over one or more electrical components, which are mounted to a QFN leadframe. The placement of the electrical components between the QFN leadframe and the semiconductor die facilitates better package integration and miniaturization of the overall package. Additional advantages are achieved by the various embodiments provided herein. For example, an impedance profile between a semiconductor die and capacitors that are stacked below the semiconductor die may be improved since a more direct electrical connection (e.g., a shorter conductive path) is possible in embodiments where the capacitors are positioned below the die. Additionally, the embodiments provided herein allow for a reduced size of a PCB that is to be connected to the completed QFN packages, since the PCB does not need additional space to accommodate the one or more electrical components that are integrated in the QFN packages.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a die pad having a first recess region, a second recess region, and a raised region spaced inward from the first and second recess regions;
 a first lead spaced apart from the die pad and having a third recess region aligned with the first recess region of the die pad;
 a second lead spaced apart from the die pad having a fourth recess region aligned with the second recess region;
 a first electrical component having a first contact and a second contact on a first surface of the first electrical component, the first contact of the first electrical component iscoupled to a surface of the first recess region of the die pad, the second contact of the first electrical component is coupled to a surface of the third recess region of the first lead;
 a second electrical component having a first contact and a second contact on a first surface of the second electrical component, the first contact of the second electrical component is coupled to a surface of the second recess region of the die pad, and the second contact is coupled to a surface of the fourth recess region of the second lead;
 a semiconductor die overlaps the die pad and the first and second electrical components, the semiconductor die is mechanically coupled to second surfaces of the first and second electrical components that are opposite to the first surfaces of the first and second electrical components by an adhesive, the first and second electrical components are between the semiconductor die and the die pad, the semiconductor die includes:
  a first sidewall over and aligned with the first electrical component; and
  a second sidewall over and aligned with the second electrical component.

2. The device of claim 1, wherein the first surface of the first lead and the first surface of the die pad are substantially at a same level.

3. The device of claim 1, further comprising a die support on the raised region of the die pad and coupled to a surface of the semiconductor die facing towards the first electrical component, the second electrical component, and the die pad.

4. The device of claim 1, comprising a plurality of third leads each spaced apart from an outer perimeter of the die pad and having a surface area that is smaller than a surface area of the first and second leads in a plane that is parallel to the first surface of the first lead.

5. The device of claim 1, wherein:
 the first electrical component includes a third contact and a fourth contact on the second surface of the first electrical component, the third and fourth contacts of the first lead are on the semiconductor die; and
 the second electrical component includes a third contact and a fourth contact on the second surface of the second electrical component, the third and fourth contacts of the second lead are on the semiconductor die.

6. The device of claim 5, wherein:
 the first electrical component includes a first side connection structure and a second side connection structure, the first side connection structure meeting the first contact and the third contact on a first side surface of the first electrical component, the second side connection structure meeting the second contact and the fourth contact on a second side surface of the first electrical component that is opposite to the first side surface of the first electrical component and the second electrical component includes a first side connection structure and a second side connection structure, the first side connection structure meeting the first contact and the third contact on a first side surface of the second electrical component, the second side connection structure meeting the second contact and the fourth contact on a second side surface of the second electrical component that is opposite to the first side surface of the second electrical component.

7. The device of claim 1, further comprising conductive glue that electrically and mechanically couples the first contacts of the first and second electrical components to the die pad and the second contacts of the first and second electrical components to the first lead, respectively.

8. The device of claim 1, further comprising an encapsulation material around the semiconductor die, the first and second electrical components, and over the die pad and the first and second leads, wherein an exposed surface of the first lead and an exposed surface of the die pad are exposed from the encapsulation material.

9. The device of claim 8, wherein at least a part of a lateral surface of the die pad and at least a part of respective lateral surfaces of the first and second leads remain exposed from the encapsulation material, the part of the lateral surface of the die pad facing the part of the lateral surface of the first lead.

10. The device of claim 1, wherein the die pad and the first and second leads are part of a quad flat no-lead (QFN) leadframe.

11. The device of claim 1, wherein the first and second electrical components include at least one of the following of a resistor, a capacitor, and an inductor.

12. A structure, comprising:
a quad flat no-lead (QFN) leadframe including:
    a plurality of recessed leads, each respective recessed lead of the plurality of first recessed leads including opposing first and second surfaces and a first recessed surface between the first and second surfaces; and
    a die pad including a plurality of second recessed surfaces, each respective second recessed surface of the plurality of recessed surfaces is aligned with a corresponding first recessed surface of the first recessed surfaces of the plurality of recessed leads;
a plurality of electrical components each including a first terminal and a second terminal, the first terminals of the plurality of electrical components are coupled to the first recessed surfaces of the plurality of recessed leads, and the second terminals of the plurality of electrical components are coupled to the plurality of second recessed surfaces of the die pad; and
a semiconductor die on the plurality of electrical components, the semiconductor die being spaced from the die pad by the plurality of electrical components, the semiconductor die having an active surface facing away from the die pad, the semiconductor die is mechanically coupled to the plurality of electrical components by an adhesive, and the plurality of electrical components is between the die pad and the semiconductor die.

13. The structure of claim 12, further comprising a wire bond coupled between the active surface of the semiconductor die and a lead of the plurality of leads of the QFN leadframe and a die support between the die pad and the semiconductor die.

14. The structure of claim 12 wherein the second terminals of the plurality of leads are between the semiconductor die and the die pad.

15. The structure of claim 14 wherein the first terminals of the plurality of leads are spaced laterally outward from the semiconductor die.

16. The structure of claim 13, further comprising an encapsulation layer over the semiconductor die, the plurality of electrical components, the wire bonds, the die pad and the leads.

17. The structure of claim 12, further comprising a conductive glue positioned between the first terminals of the plurality of electrical components and the respective leads, and positioned between the second terminals of the plurality of electrical components and the die pad.

18. A structure, comprising:
a leadframe including a die pad and a lead, the lead spaced from the die pad;
an electrical component including a first terminal and a second terminal, the first terminal of the electrical component coupled to the lead, and the second terminal of the electrical component coupled to the die pad; and
a semiconductor die mechanically coupled to the electrical component by an adhesive at a region of the electrical component between the first terminal and the second terminal, the semiconductor die being spaced from the die pad by the electrical component, and the electrical component is between the semiconductor die and the die pad.

19. The structure of claim 18, further comprising:
a wire bond coupled between an active surface of the semiconductor die facing away from the die pad and the lead; and
an encapsulation layer over the semiconductor die, the electrical component, the wire bond, the die pad and the lead.

20. The structure of claim 19 wherein the encapsulation layer is positioned between the lead and the die pad.

* * * * *

UNITED STATES PATENT AND TRADEMARK OFFICE
CERTIFICATE OF CORRECTION

PATENT NO. : 11,842,948 B2
APPLICATION NO. : 17/244378
DATED : December 12, 2023
INVENTOR(S) : Cristina Somma et al.

It is certified that error appears in the above-identified patent and that said Letters Patent is hereby corrected as shown below:

In the Claims

Column 10, Claim 1, Lines 18-19:
"component iscoupled to a surface" should read: -- component is coupled to a surface --.

Column 11, Claim 6, Line 6:
"electrical component and" should read: -- electrical component; and --.

Signed and Sealed this
Twentieth Day of February, 2024

Katherine Kelly Vidal
*Director of the United States Patent and Trademark Office*